United States Patent
Huang (10) Patent No.: US 10,510,499 B1
(45) Date of Patent: Dec. 17, 2019

(54) SMD SWITCH AND TOUCHPAD MODULE AND COMPUTING DEVICE USING SAME

(71) Applicant: Primax Electronics Ltd., Taipei (TW)

(72) Inventor: Tai-Sou Huang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/168,393

(22) Filed: Oct. 23, 2018

(30) Foreign Application Priority Data

Aug. 10, 2018 (TW) .............................. 107127982 A (51) Int. Cl.
*H01H 13/705* (2006.01)
*H03K 17/965* (2006.01)
*G06F 1/16* (2006.01)
*G06F 3/0354* (2013.01)

(52) U.S. Cl.
CPC .......... *H01H 13/705* (2013.01); *G06F 1/169* (2013.01); *G06F 3/03547* (2013.01); *H03K 17/965* (2013.01)

(58) Field of Classification Search
CPC ... H01H 13/705; G06F 1/169; G06F 3/03547; H03K 17/965

USPC .......................... 200/237, 406, 511–514, 516
See application file for complete search history.

(56) References Cited

U.S. PATENT DOCUMENTS 7,902,474 B2 * 3/2011 Mittleman ............. H01H 13/79
200/5 A
2005/0236265 A1 * 10/2005 Kobayashi ......... H01H 13/7006
200/511

* cited by examiner

*Primary Examiner* — Edwin A. Leon
*Assistant Examiner* — Lheiren Mae A Caroc
(74) *Attorney, Agent, or Firm* — Kirton McConkie; Evan R. Witt (57) ABSTRACT

A surface mount device switch includes a pedestal, a metal dome and a conductive buffering sheet. A pedestal contact part of the pedestal is electrically connected with a circuit board. The conductive buffering sheet is arranged between the pedestal and the metal dome. Due to the conductive buffering sheet, the metal dome does not collide with the conducting part of the pedestal to generate the click sound. Consequently, the comfort of operating the touchpad module is enhanced. The present invention further provides a touchpad module and a computing device with the surface mount device switch.

19 Claims, 11 Drawing Sheets

SMD SWITCH AND TOUCHPAD MODULE AND COMPUTING DEVICE USING SAME

FIELD OF THE INVENTION

The present invention relates to an input device, and more particularly to an input device with a touch control function.

BACKGROUND OF THE INVENTION

With increasing development of science and technology, a variety of electronic devices are designed in views of convenience and user-friendliness. For helping the user well operate the electronic devices, the electronic devices are gradually developed in views of humanization. The common electronic devices include for example notebook computers, mobile phones, satellite navigation devices, or the like. Recently, the storage capacity and the processor's computing performance for these electronic devices are largely enhanced, and thus their functions become more powerful and complicated. For efficiently operating an electronic device, a touchpad is used as an input device of the electronic device for controlling the operations of the electronic device.

Figure 1:
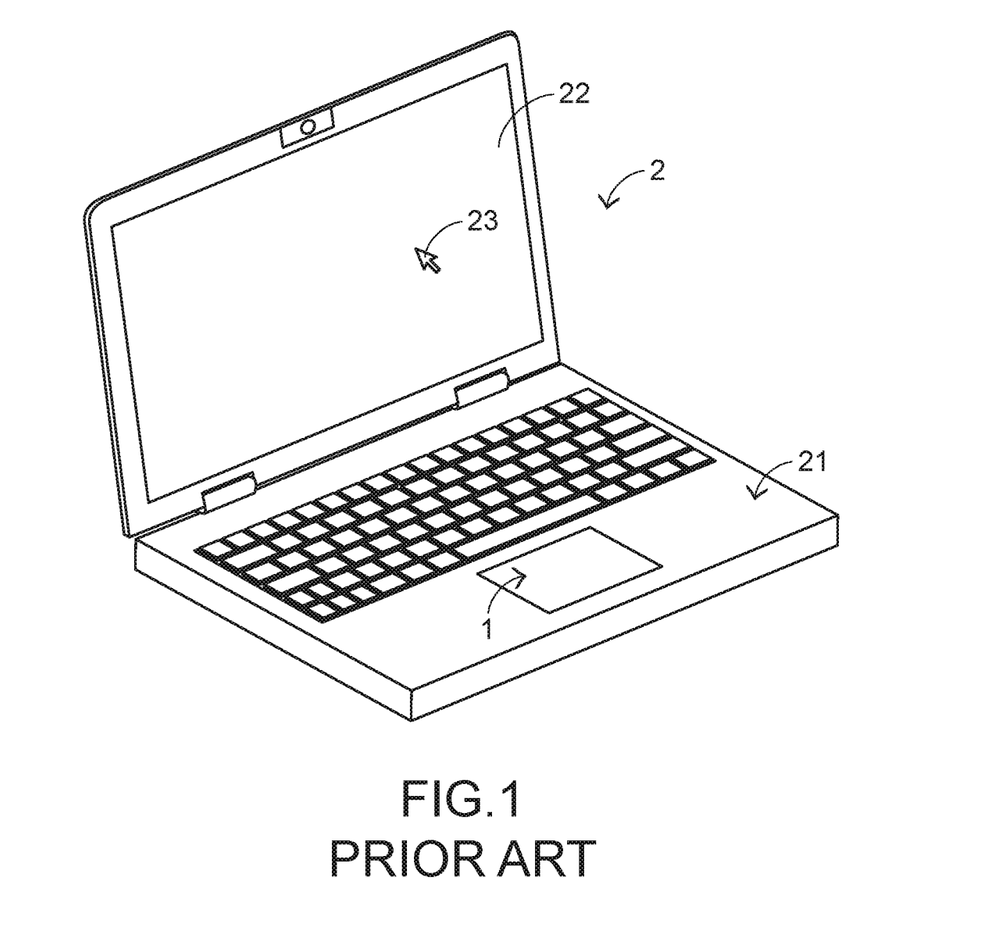
FIG. 1 schematically illustrates a conventional notebook computer with a touchpad module.

FIG. 1 schematically illustrates a conventional notebook computer with a touchpad module. As shown in FIG. 1, the touchpad module 1 is installed on a casing 21 of the notebook computer 2. Moreover, at least a portion of the touchpad module 1 is exposed outside so as to be touched by the user's finger. Consequently, the user may operate the touchpad module 1 to control the notebook computer 2. For example, in case that the user's finger is placed on the touchpad module 1 and slid on the touchpad module 1, a cursor 23 shown on a display screen 22 of the notebook computer 2 is correspondingly moved. Moreover, in case that the touchpad module 1 is pressed down by the user's finger, the notebook computer 2 executes a specified function. The use of the touchpad module 1 can implement some functions of the conventional mouse. In other words, the user may operate the notebook computer 2 through the touchpad module 1 without the need of additionally carrying or installing the mouse.

Figure 2:
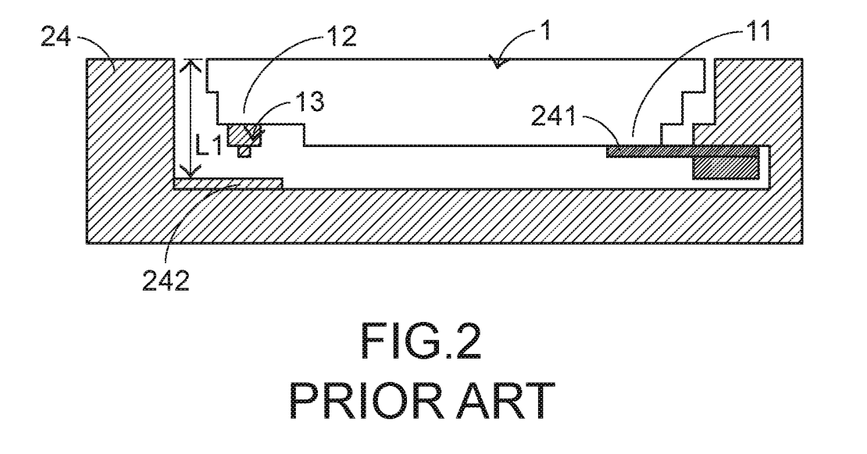
FIG. 2 is a schematic cross-sectional view illustrating the touchpad module as shown in FIG. 1, in which the touchpad module is not pressed down.
Figure 3:
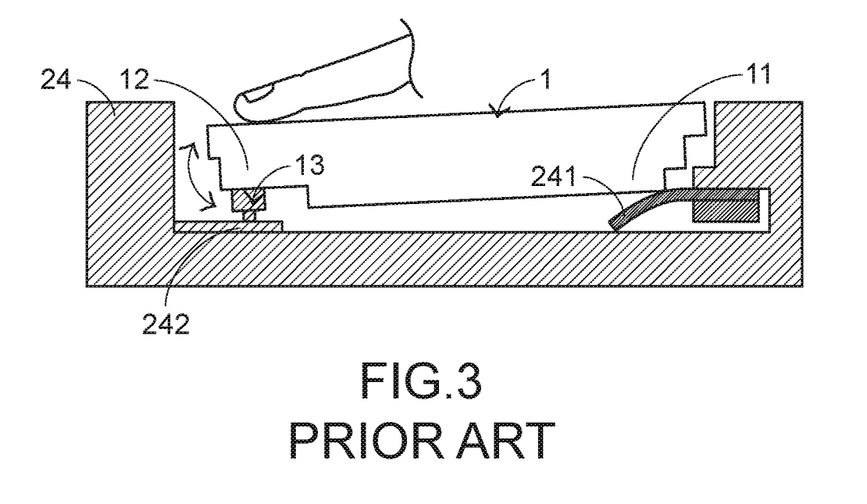
FIG. 3 is a schematic cross-sectional view illustrating the touchpad module as shown in FIG. 1, in which the touchpad module is pressed down.
Figure 4:
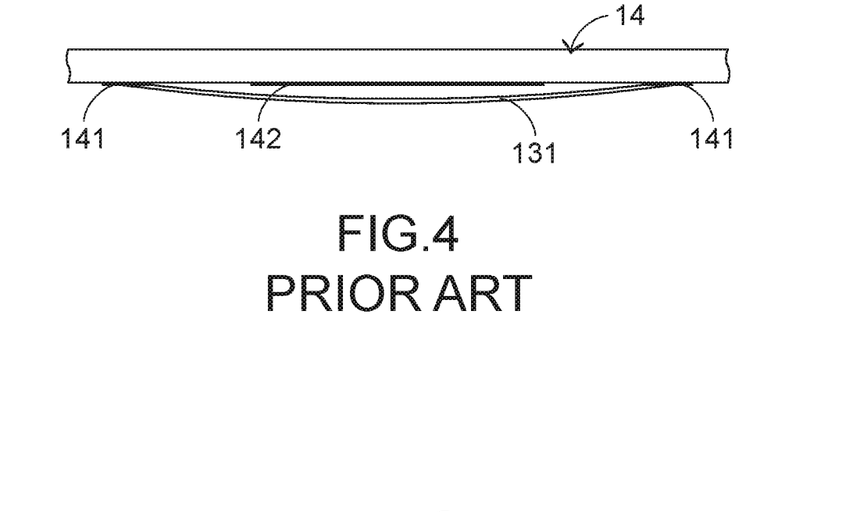
FIG. 4 is a schematic cross-sectional view illustrating portions of a circuit board and a switch element of the touchpad module as shown in FIG. 1.

FIG. 2 is a schematic cross-sectional view illustrating the touchpad module as shown in FIG. 1, in which the touchpad module is not pressed down. FIG. 3 is a schematic cross-sectional view illustrating the touchpad module as shown in FIG. 1, in which the touchpad module is pressed down. FIG. 4 is a schematic cross-sectional view illustrating portions of a circuit board and a switch element of the touchpad module as shown in FIG. 1. As shown in FIGS. 2, 3 and 4, a fixing frame 24 is concavely formed in the casing 21 of the notebook computer 2. A supporting structure 241 and a triggering part 242 are respectively protruded from two opposite sides of an inner wall of the fixing frame 24. A first end 11 of the touchpad module 1 is connected with the supporting structure 241. Consequently, a second end 12 of the touchpad module 1 may be swung relative to the triggering part 242 by using the supporting structure 241 as a fulcrum.

The touchpad module 1 further comprises a switch element 13 and a circuit board 14. The switch element 13 is located under the second end 12 of the touchpad module 1 and aligned with the triggering part 242. The switch element 13 comprises a metal dome 131. A first conducting part 141 and a second conducting part 142 corresponding to the metal dome 131 are disposed on the circuit board 14. The first conducting part 141 and the second conducting part 142 are separated from each other by a gap. When the touchpad module 1 is not pressed down, the metal dome 131 is not subjected to deformation. Meanwhile, as shown in FIG. 4, the metal dome 131 is contacted with the first conducting part 141 but not contacted with the second conducting part 142.

While the touchpad module 1 is pressed down by the user, the second end 12 of the touchpad module 1 is swung downwardly relative to the triggering part 242 by using the supporting structure 241 as a fulcrum. When the switch element 13 of the touchpad module 1 is pushed by the triggering part 242 of the fixing frame 24, the metal dome 131 is subjected to deformation. At the same time, the metal dome 131 is contacted with both of the first conducting part 141 and the second conducting part 142, and the electric connection between the first conducting part 141 and the second conducting part 142 is established. Under this circumstance, the switch element 13 is triggered to generate a switch signal to the notebook computer 2. According to the switch signal, the notebook computer 2 executes a corresponding function. When the touchpad module 1 is no longer pressed by the user, the second end 12 of the touchpad module 1 is swung upwardly relative to the triggering part 242 in response to the elastic force of the metal dome 131 and/or the elastic force of the supporting structure 241. Consequently, the metal dome 131 is restored to its original shape (see FIG. 4) and the touchpad module 1 is returned to its original position.

However, the conventional touchpad module 1 still has some drawbacks. For example, while the touchpad module 1 is pressed down by the user, unpleasant noise is generated. The source of the noise includes the click sound in response to the collision between the switch element 13 and the triggering part 242 and the click sound in response to the collision between the deformed metal dome 131 and the second conducting part 142. For solving this problem, some other touchpad modules have been disclosed. In accordance with a conventional touchpad module, a rubber element (not shown) is disposed on the triggering part 242 to alleviate the collision between the switch element 13 and the triggering part 242. In accordance with another conventional touchpad module, a rubber cover is sheathed around the switch element 13. Due to the rubber cover, the click sound inside the touchpad module is blocked from being outputted from the touchpad module. However, regardless of whether the rubber element is installed on the triggering part 242 or the rubber cover is sheathed around the switch element 13, the efficacy of reducing the noise is limited. In other words, the touchpad module needs to be further improved.

SUMMARY OF THE INVENTION

A first object of the present invention provides a surface mount device (SMD) switch. The SMD switch includes a pedestal, a metal dome and a conductive buffering sheet. The conductive buffering sheet is arranged between the pedestal and the metal dome. When the metal dome is subjected to deformation, the metal dome does not collide with the conducting part of the pedestal to generate the click sound. Consequently, the comfort of operating the touchpad module is enhanced.

A second object of the present invention provides a touchpad module with the SMD switch.

A third object of the present invention provides a computing device with the touchpad module.

In accordance with an aspect of the present invention, there is provided a touchpad module. The touchpad module includes a circuit board and a surface mount device switch. The circuit board includes at least one circuit board contact part. The surface mount device switch includes a pedestal, a metal dome and at least one conductive buffering sheet. The pedestal is located under the circuit board, and includes a first conducting part, a second conducting part and at least one pedestal contact part. The at least one pedestal contact part is electrically connected with the at least one circuit board contact part. The at least one conductive buffering sheet is arranged between the metal dome and the pedestal, and contacted with the first conducting part and/or the second conducting part. When the circuit board is pressed down and the surface mount device switch is moved downwardly to push a triggering part, the metal dome is subjected to deformation and contacted with the at least one conductive buffering sheet, so that the first conducting part and the second conducting part are electrically connected with each other.

In accordance with another aspect of the present invention, there is provided a computing device. The computing device includes a casing, a processor and a touchpad module. A fixing frame is concavely formed in the casing. The processor is disposed within the casing. The touchpad module is disposed within the fixing frame and electrically connected with the processor. The touchpad module includes a circuit board and a surface mount device switch. The circuit board includes at least one circuit board contact part. The surface mount device switch includes a circuit board and a surface mount device switch. The circuit board includes at least one circuit board contact part. The surface mount device switch includes a pedestal, a metal dome and at least one conductive buffering sheet. The pedestal is located under the circuit board, and includes a first conducting part, a second conducting part and at least one pedestal contact part. The at least one pedestal contact part is electrically connected with the at least one circuit board contact part. The at least one conductive buffering sheet is arranged between the metal dome and the pedestal, and contacted with the first conducting part and/or the second conducting part. When the circuit board is pressed down and the surface mount device switch is moved downwardly to push a triggering part, the metal dome is subjected to deformation and contacted with the at least one conductive buffering sheet, so that the first conducting part and the second conducting part are electrically connected with each other.

In accordance with a further aspect of the present invention, there is provided a surface mount device switch for a touchpad module with a circuit board. The surface mount device switch includes a pedestal, a metal dome and at least one conductive buffering sheet. The pedestal includes a first conducting part, a second conducting part and at least one pedestal contact part. The at least one pedestal contact part is electrically connected with the circuit board. The at least one conductive buffering sheet is arranged between the metal dome and the pedestal, and contacted with the first conducting part and/or the second conducting part. When the surface mount device switch pushes a triggering part, the metal dome is subjected to deformation and contacted with the at least one conductive buffering sheet, so that the first conducting part and the second conducting part are electrically connected with each other.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 5:
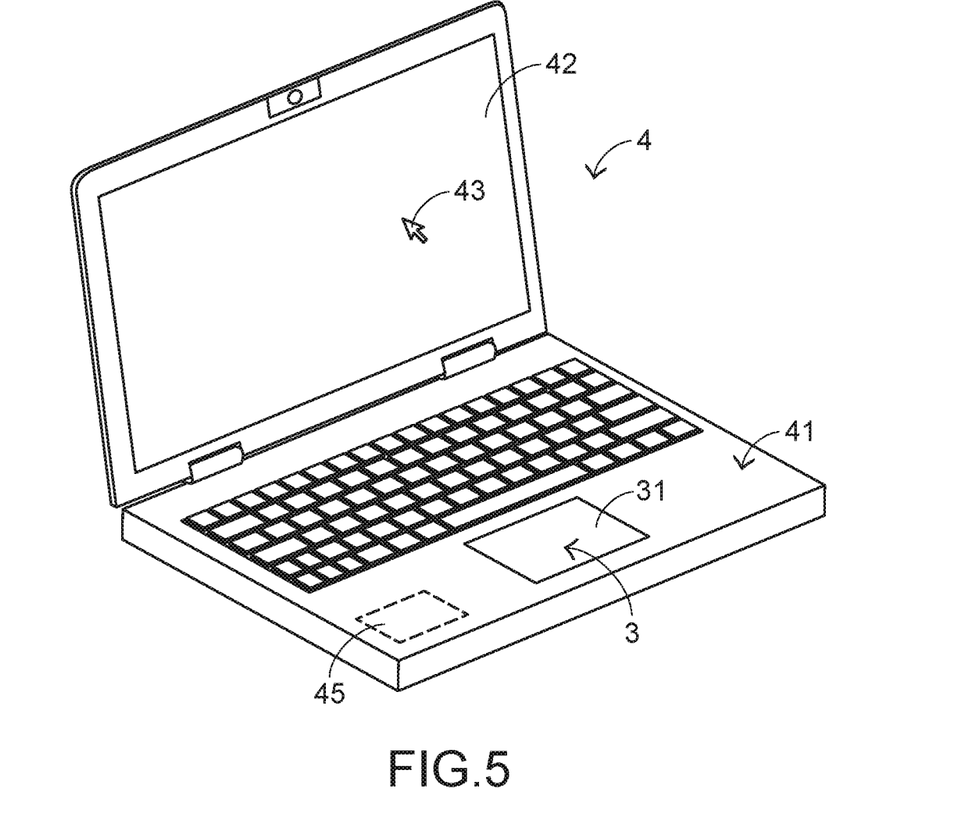
FIG. 5 is a schematic perspective view illustrating the outer appearance of a computing device with a touchpad module according to an embodiment of the present invention.

FIG. 5 is a schematic perspective view illustrating the outer appearance of a computing device with a touchpad module according to an embodiment of the present invention. An example of the computing device 4 includes but is not limited to a notebook computer. In an embodiment, the computing device 4 comprises a casing 41, a display screen 42, a processor 45 and a touchpad module 3. The processor 45 is disposed within the casing 41. Moreover, the processor 45 is used for processing electronic signals of the computing device 4. Moreover, a fixing frame 44 is concavely formed in the casing 41 (see FIGS. 6 and 7). The touchpad module 3 is disposed within the fixing frame 44 and electrically connected with the processor 45. In addition, at least a portion of the touchpad module 3 is exposed outside so as to be touched by the user's finger. Consequently, the user may operate the touchpad module 3 to control the computing device 4. For example, in case that the user's finger is placed on the touchpad module 3 and slid on the touchpad module 3, a cursor 43 shown on the display screen 42 is correspondingly moved. Moreover, in case that the touchpad module 3 is pressed by the user's finger, the computing device 4 executes a specified function.

Figure 6:
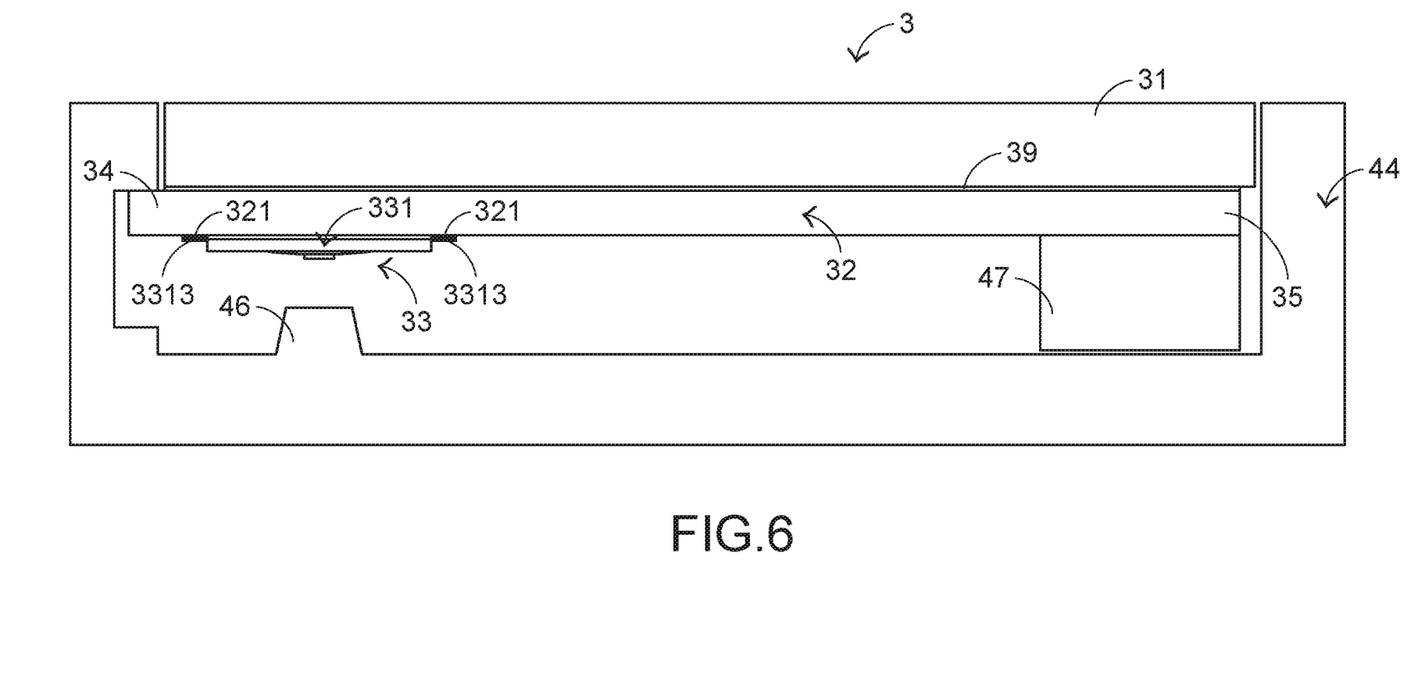
FIG. 6 is a schematic cross-sectional view illustrating portions of a fixing frame and a touchpad module of the computing device as shown in FIG. 5.

FIG. 6 is a schematic cross-sectional view illustrating portions of a fixing frame and a touchpad module of the computing device as shown in FIG. 5. The fixing frame 44 of the computing device 4 comprises an accommodation space 441. The touchpad module 3 is accommodated within the accommodation space 441. From top to bottom, the touchpad module 3 comprises a covering plate 31, an adhesive layer 39, a circuit board 32 and a surface mount device (SMD) switch 33. The covering plate 31 and the circuit board 32 are combined together through the adhesive layer 39. The SMD switch 33 is disposed on a bottom surface of the circuit board 32 and located at a first end 34 of the touchpad module 3. The circuit board 32 comprises plural circuit board contact parts 321. The circuit board contact parts 321 are electrically connected with the SMD switch 33. A top surface of the covering plate 31 is exposed outside. Consequently, the covering plate 31 can be touched and operated by the user. When the circuit board 32 senses the touching and operating behavior of the user on the covering plate 31, the circuit board 32 issues a corresponding electronic signal. According to the electronic signal, the computing device 4 executes a corresponding command. Preferably but not exclusively, the covering plate 31 is a glass covering plate or a plastic covering plate, and the adhesive layer 39 is made of a pressure sensitive adhesive (PSA).

The computing device 4 further comprises a triggering part 46 and a supporting structure 47. The triggering part 46 and the supporting structure 47 are disposed on an inner side of the fixing frame 44 and accommodated within the accommodation space 441 of the fixing frame 44. A second end 35 of the touchpad module 3 is disposed on the supporting structure 47. During the process of swinging the first end 34 of the touchpad module 3, the second end 35 of the touchpad module 3 is used as a fulcrum. The triggering part 46 is aligned with the SMD switch 33. While the first end 34 of the touchpad module 3 is swung downwardly, the triggering part 46 is contacted with the SMD switch 33. The triggering part 46 is a raised structure or a flat surface. In addition, the triggering part 46 is integrally formed with the fixing frame 44. Alternatively, the triggering part 46 is one of the components within the fixing frame 44.

Figure 7:
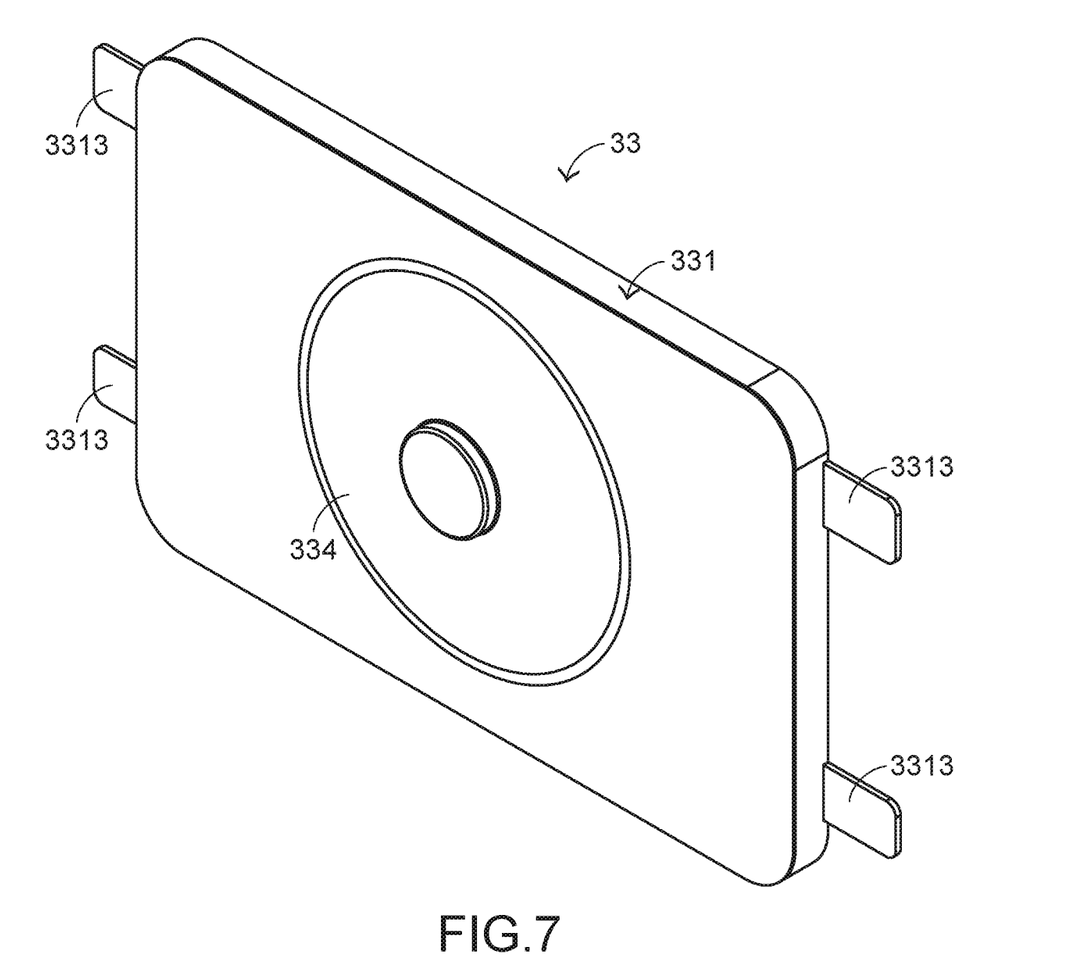
FIG. 7 is a schematic perspective view illustrating the outer appearance of the SMD switch of the touchpad module as shown in FIG. 6.
Figure 8:
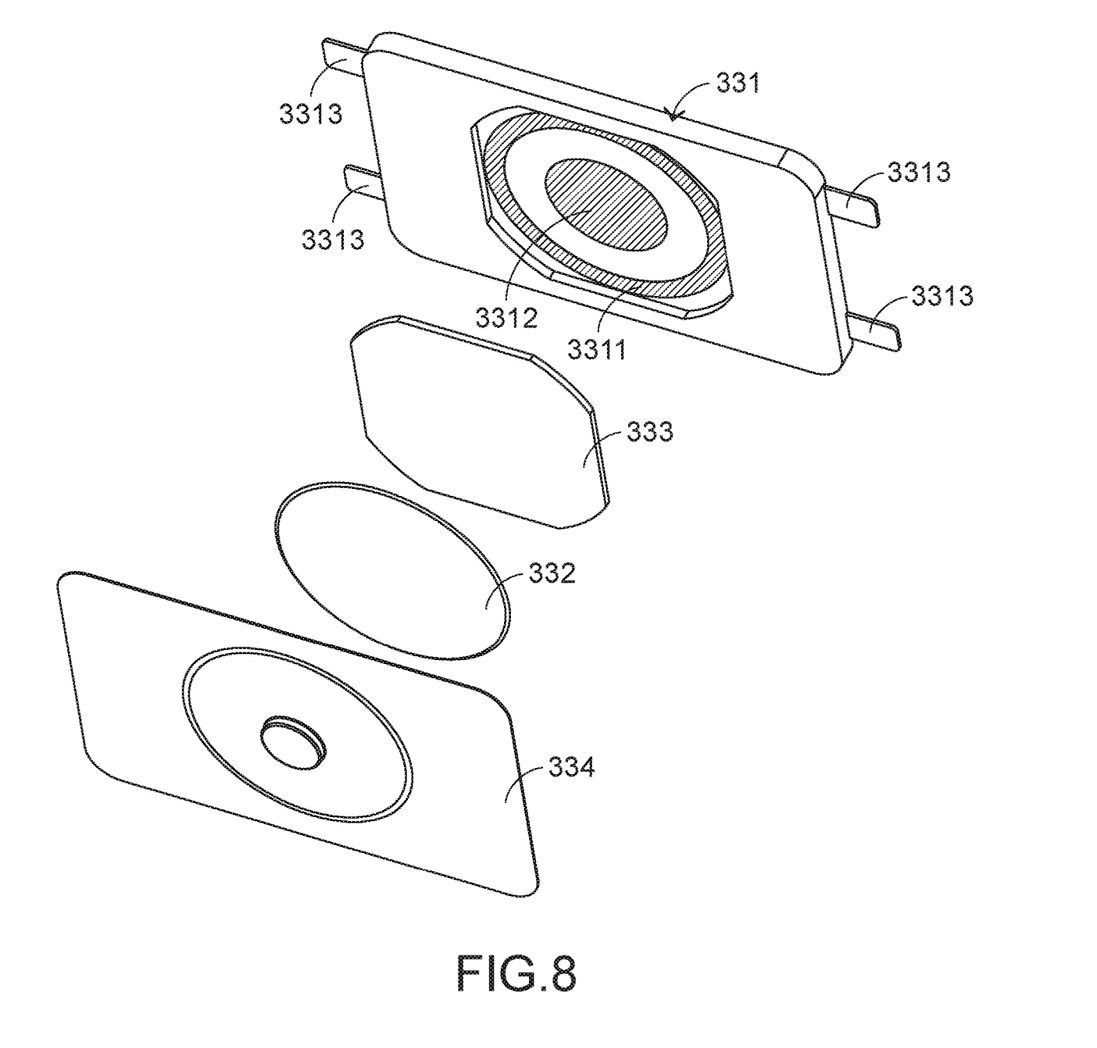
FIG. 8 is a schematic exploded view illustrating the SMD switch as shown in FIG. 7 of the touchpad module and taken along a viewpoint.
Figure 9:
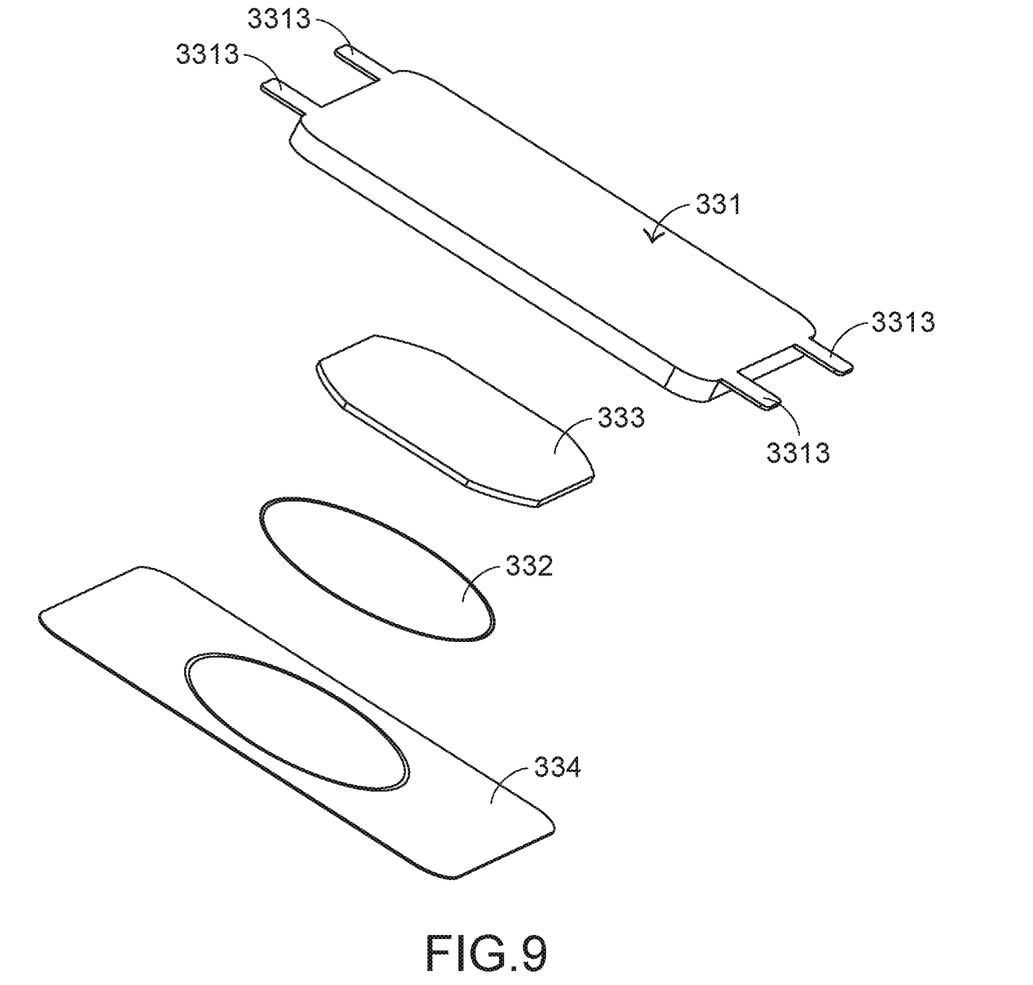
FIG. 9 is a schematic exploded view illustrating the SMD switch of the touchpad module as shown in FIG. 7 and taken along another viewpoint.
Figure 10:
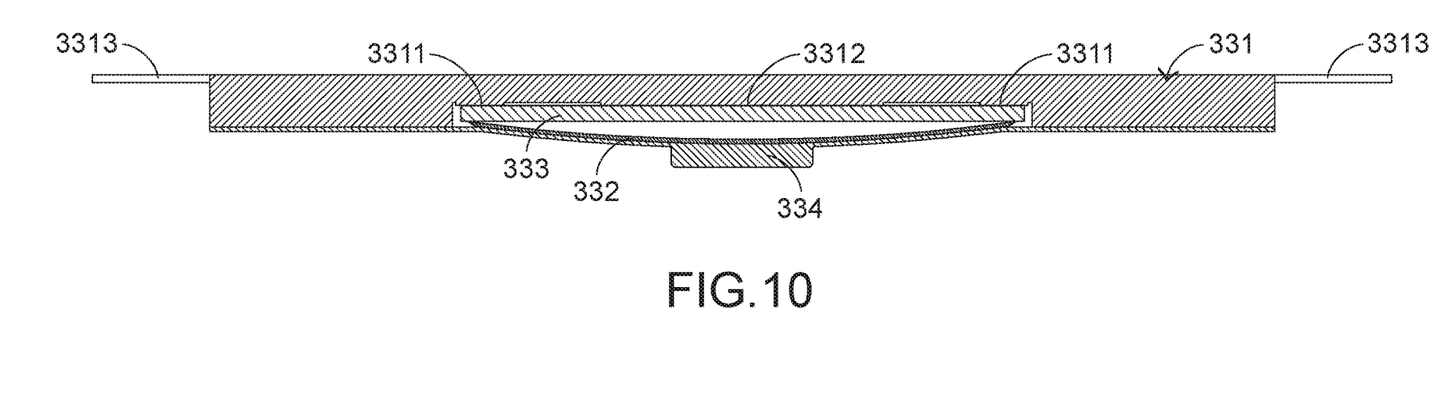
FIG. 10 is a schematic cross-sectional view illustrating the SMD switch of the touchpad module as shown in FIG. 7.

Please refer to FIGS. 7, 8, 9 and 10. FIG. 7 is a schematic perspective view illustrating the outer appearance of the SMD switch of the touchpad module as shown in FIG. 6. FIG. 8 is a schematic exploded view illustrating the SMD switch of the touchpad module as shown in FIG. 7 and taken along a viewpoint. FIG. 9 is a schematic exploded view illustrating the SMD switch of the touchpad module as shown in FIG. 7 and taken along another viewpoint. FIG. 10 is a schematic cross-sectional view illustrating the SMD switch of the touchpad module as shown in FIG. 7. The SMD switch 33 comprises a pedestal 331, a metal dome 332, a conductive buffering sheet 333 and a sheltering plate 334. The sheltering plate 334 is located under the pedestal 331. In addition, the metal dome 332 and the conductive buffering sheet 333 are covered between the pedestal 331 and the sheltering plate 334. Preferably but not exclusively, the sheltering plate 334 is made of a plastic material or a metallic material.

The pedestal 331 is located under the circuit board 32. The pedestal 331 comprises a first conducting part 3311, a second conducting part 3312 and plural pedestal contact parts 3313. The first conducting part 3311 and the second conducting part 3312 are located under the pedestal 331. The first conducting part 3311 and the second conducting part 3312 are separated from each other by a gap. The pedestal contact parts 3313 are located at a lateral edge of the pedestal 331. Moreover, the pedestal contact parts 3313 are electrically connected with the circuit board 32 and the circuit board contact parts 321 through solder paste or any other appropriate connecting means. Consequently, electronic signals can be transferred between the circuit board 32 and the SMD switch 33 through the pedestal contact parts 3313 and the circuit board contact parts 321.

The conductive buffering sheet 333 is arranged between the metal dome 332 and the pedestal 331. Moreover, the conductive buffering sheet 333 is contacted with the first conducting part 3311 and the second conducting part 3312. When the touchpad module 3 is not pressed, only the portion of the metal dome 332 perpendicularly aligned with the first conducting part 3311 is contacted with the conductive buffering sheet 333, and the portion of the metal dome 332 perpendicularly aligned with the second conducting part 3312 is separated from the conductive buffering sheet 333 by a vertical spacing distance (see FIG. 10). Preferably but not exclusively, the pedestal contact parts 3313 are electric pads or pins, and the conductive buffering sheet 333 is an anisotropic conductive sheet that is electrically conducted along a vertical direction (e.g., the Z direction) but not electrically conducted along horizontal directions (e.g., the X direction and the Y direction).

Figure 11:
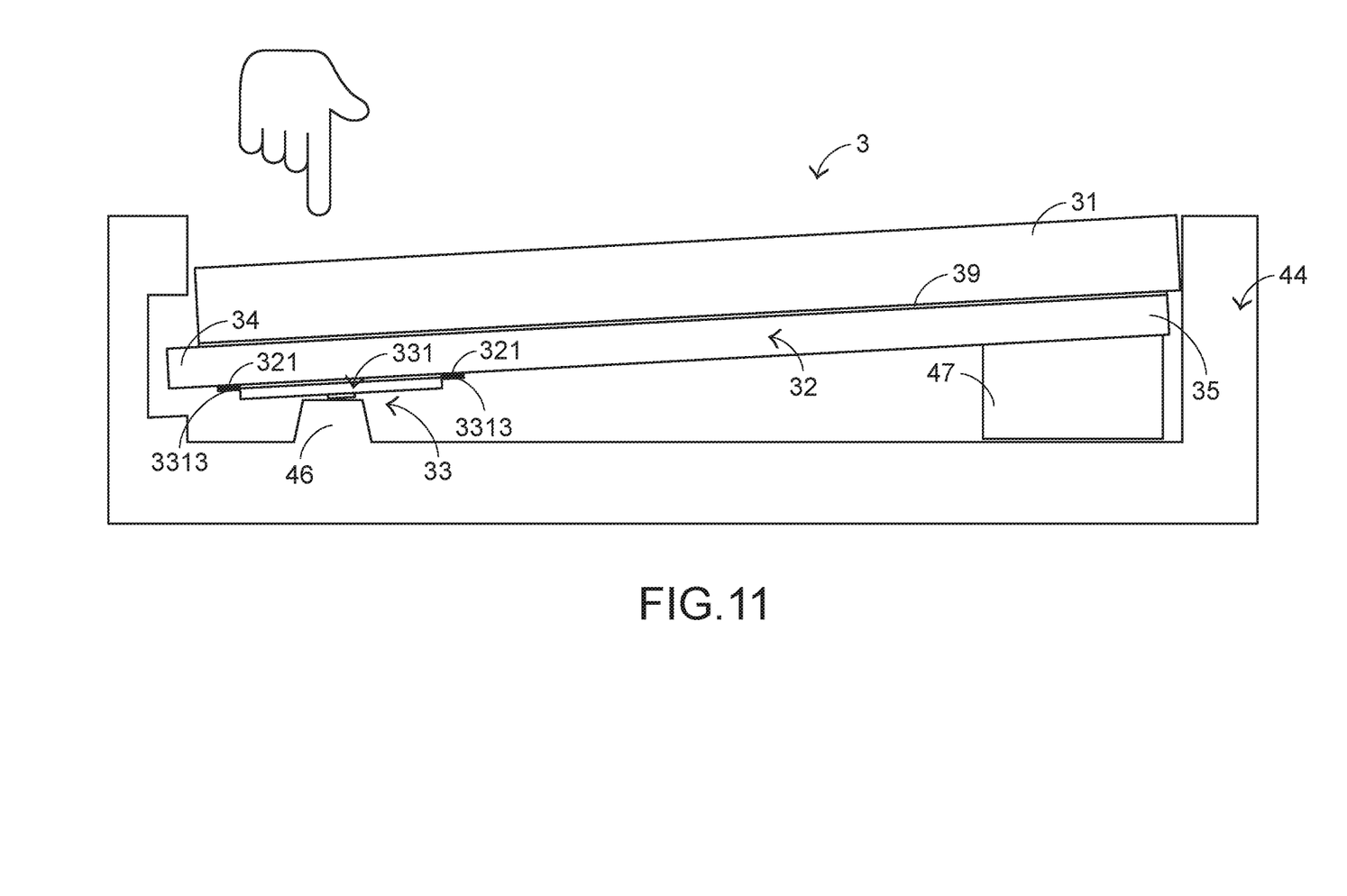
FIG. 11 is a schematic cross-sectional view illustrating the touchpad module as shown in FIG. 6, in which the touchpad module is pressed down.

FIG. 11 is a schematic cross-sectional view illustrating the touchpad module as shown in FIG. 6, in which the touchpad module is pressed down. While the covering plate 31 of the touchpad module 3 is pressed down by the user, the first end 34 of the touchpad module 3 is swung downwardly relative to the triggering part 46 by using the supporting structure 47 as a fulcrum. When the SMD switch 33 is pushed by the triggering part 46, the metal dome 332 of the SMD switch 33 is subjected to deformation. While the metal dome 332 is subjected to deformation, the portion of the metal dome 332 perpendicularly aligned with the first conducting part 3311 and the portion of the metal dome 332 perpendicularly aligned with the second conducting part 3312 are contacted with the conductive buffering sheet 333. Since the conductive buffering sheet 333 is contacted with both of the first conducting part 3311 and the second conducting part 3312, the electric connection between the first conducting part 3311 and the second conducting part 3312 is established and the SMD switch 33 is triggered. At the same time, the circuit board 32 electrically connected with the SMD switch 33 issues a corresponding electronic signal to the computing device. According to the electronic signal, the computing device 4 executes a corresponding function.

When the touchpad module 3 is no longer pressed by the user, the first end 34 of the touchpad module 3 is swung upwardly relative to the triggering part 46 in response to the elastic force of the metal dome 332 and/or the elastic force of the supporting structure 47. Consequently, the metal dome 332 is restored to its original shape (see FIG. 10) and the touchpad module 3 is returned to its original position.

As mentioned above, the touchpad module 3 is equipped with the SMD switch 33, and the conductive buffering sheet 333 is arranged between the pedestal 331 and the metal dome 332. That is, when the metal dome 332 is subjected to deformation, the metal dome 332 does not collide with the second conducting part 3312 to generate the click sound. Consequently, the comfort of operating the touchpad module 3 is enhanced.

In the above embodiment, the touchpad module 3 is equipped with a single conductive buffering sheet 333 between the pedestal 331 and the metal dome 332, and the single conductive buffering sheet 333 is an anisotropic conductive sheet. It is noted that numerous modifications and alterations may be made while retaining the teachings of the invention. For example, in another embodiment, the touchpad module 3 is equipped with two conductive buffering sheets 333 between the pedestal 331 and the metal dome 332. The two conductive buffering sheets 333 are aligned with the first conducting part 3311 and the second conducting part 3312. In addition, the two conductive buffering sheets 333 are separated from each other.

In the above embodiment, the conductive buffering sheet 333 is contacted with the first conducting part 3311 and the second conducting part 3312 of the pedestal 331 when the touchpad module 3 is not pressed down. In a variant example, the conductive buffering sheet 333 is not contacted with the first conducting part 3311 and the second conducting part 3312 when the touchpad module 3 is not pressed down. When the covering plate 31 is pressed down and the metal dome 332 is subjected to deformation to push the conductive buffering sheet 333, the conductive buffering sheet 333 is contacted with the first conducting part 3311 and the second conducting part 3312.

In the above embodiment, the portion of the metal dome 332 perpendicularly aligned with the first conducting part 3311 is contacted with the conductive buffering sheet 333 when the touchpad module 3 is not pressed. In a variant example, the portion of the metal dome 332 perpendicularly aligned with the first conducting part 3311 is not contacted with the conductive buffering sheet 333 when the touchpad module 3 is not pressed. When the covering plate 31 is pressed down and the metal dome 332 is subjected to deformation, the portion of the metal dome 332 perpendicularly aligned with the first conducting part 3311 and the portion of the metal dome 332 perpendicularly aligned with the second conducting part 3312 are contacted with the conductive buffering sheet 333.

Figure 12:
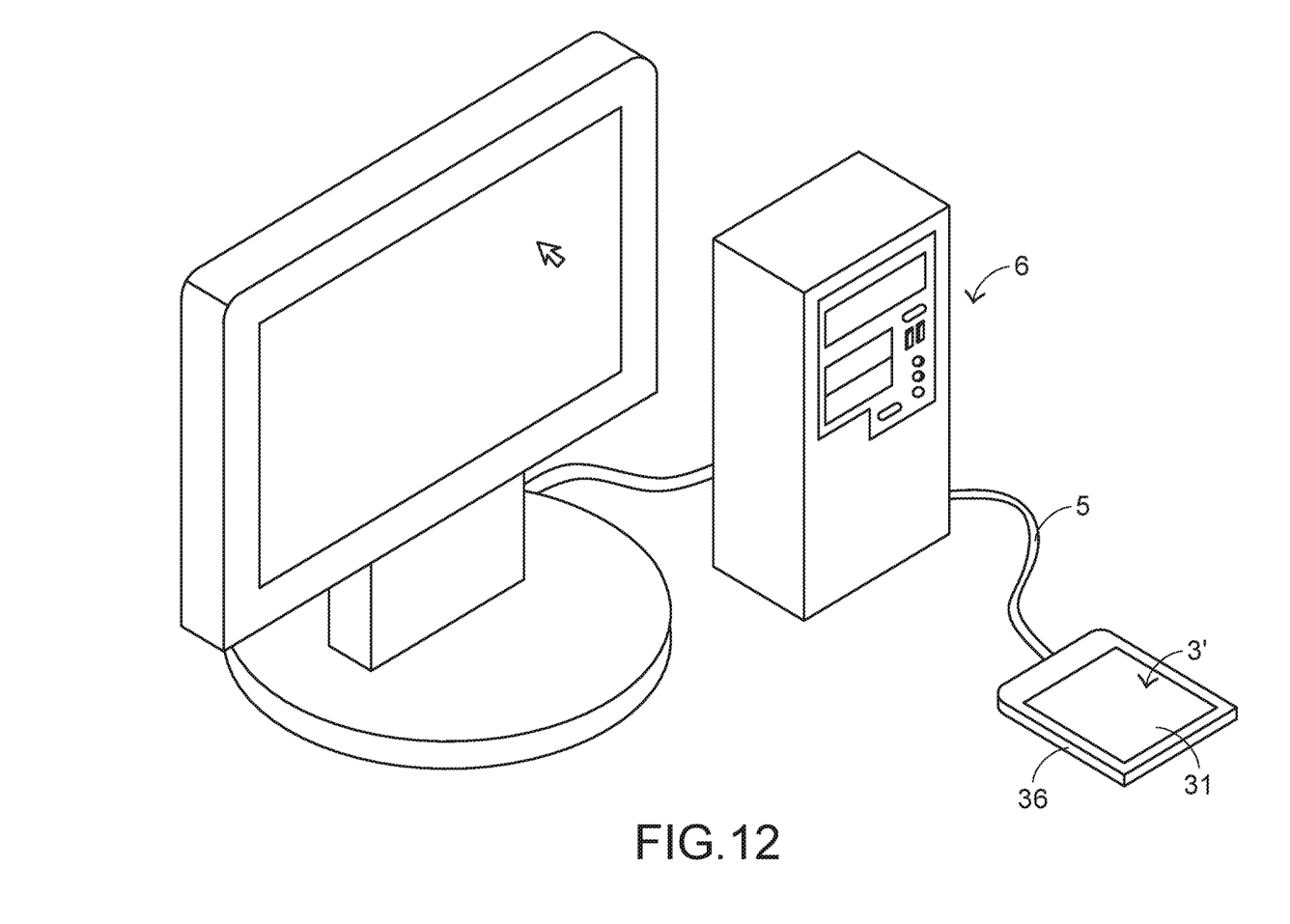
FIG. 12 schematically illustrates a touchpad module for a computing device according to another embodiment of the present invention.
Figure 13:
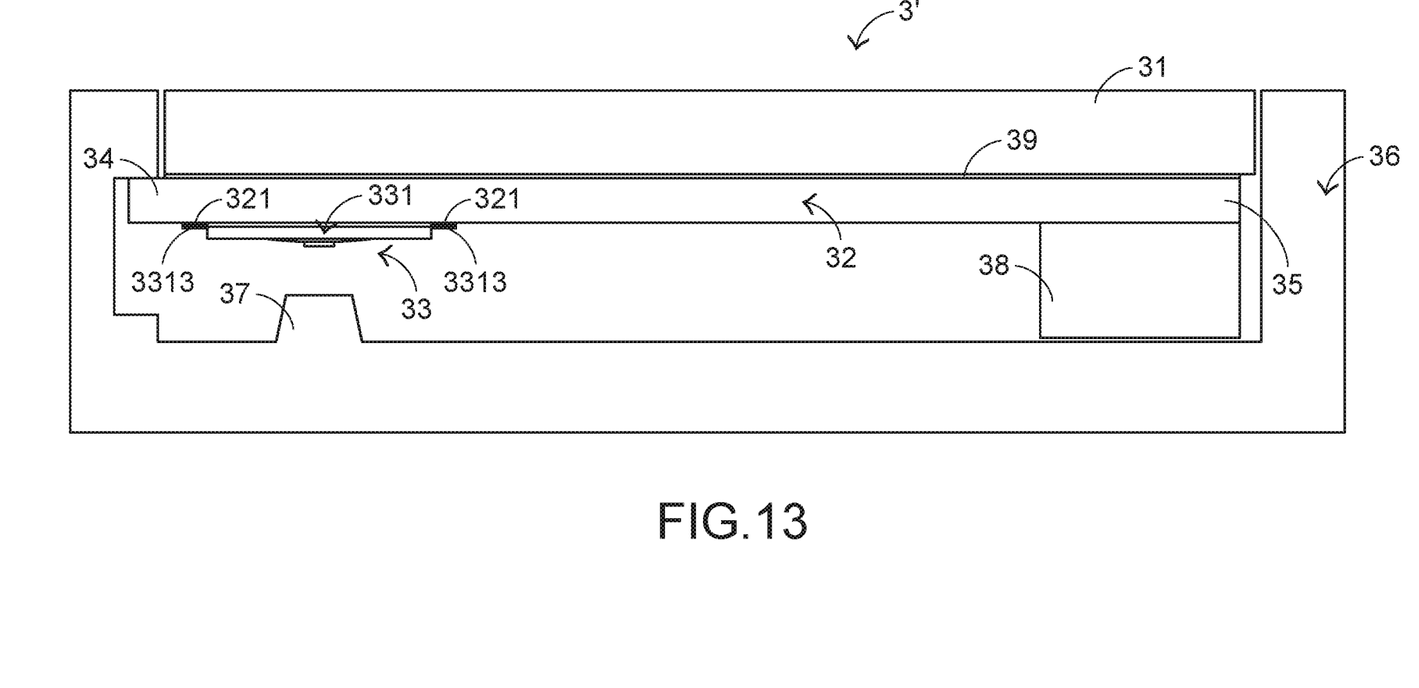
FIG. 13 is a schematic cross-sectional view illustrating a portion of the touchpad module as shown in FIG. 12.

It is noted that numerous modifications and alterations may be made while retaining the teachings of the invention. For example, in another embodiment, the touchpad module is an external input device that is independent from the electronic computing device. Please refer to FIGS. 12 and 13. FIG. 12 schematically illustrates a touchpad module for a computing device according to another embodiment of the present invention. FIG. 13 is a schematic cross-sectional view illustrating a portion of the touchpad module as shown in FIG. 12. The structures and functions of the components of the touchpad module 3' which are identical to those of the above embodiments are not redundantly described herein. The touchpad module 3' further comprises a triggering part 37, a supporting structure 38 and a fixing frame 36. The covering plate 31, the adhesive layer 39, the circuit board 32 and the SMD switch 33 are accommodated within the fixing frame 36. The triggering part 37 is a raised structure or a flat surface. In addition, the triggering part 37 is integrally formed with the fixing frame 36. Alternatively, the triggering part 37 is one of the components within the fixing frame 36. The touchpad module 3' is in communication with a desktop computer 6 through a universal serial bus (USB) 5.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A touchpad module, comprising:
   a circuit board comprising at least one circuit board contact part; and
   a surface mount device switch comprising:
      a pedestal located under the circuit board, and comprising a first conducting part, a second conducting part and at least one pedestal contact part, wherein the at least one pedestal contact part is electrically connected with the at least one circuit board contact part;
      a metal dome; and
      at least one conductive buffering sheet arranged between the metal dome and the pedestal, and contacted with the first conducting part and/or the second conducting part,
      wherein when the circuit board is pressed down and the surface mount device switch is moved downwardly to push a triggering part, the metal dome is subjected to deformation and contacted with the at least one conductive buffering sheet, so that the first conducting part and the second conducting part are electrically connected with each other.

2. The touchpad module according to claim 1, wherein the touchpad module further comprises a covering plate, and the covering plate is located over the circuit board.

3. The touchpad module according to claim 2, wherein the covering plate is a glass covering plate or a plastic covering plate, and the covering plate and the circuit board are combined together through an adhesive layer.

4. The touchpad module according to claim 1, wherein the conductive buffering sheet is an anisotropic conductive sheet.

5. The touchpad module according to claim 1, wherein the surface mount device switch further comprises a sheltering plate, wherein the sheltering plate is located under the pedestal, and the metal dome and the at least one conductive buffering sheet are covered between the pedestal and the sheltering plate.

6. The touchpad module according to claim 1, wherein the at least one pedestal contact part includes at least one electric pad or at least one pin.

7. The touchpad module according to claim 1, wherein the circuit board and the surface mount device switch are accommodated within a fixing frame, and the triggering part is disposed on an inner surface of the fixing frame so as to be pushed by the surface mount device switch.

8. The touchpad module according to claim 7, wherein the fixing frame is included in a computing device, or the touchpad module further comprises the fixing frame.

9. A computing device, comprising:
   a casing, wherein a fixing frame is concavely formed in the casing;
   a processor disposed within the casing; and
   a touchpad module disposed within the fixing frame and electrically connected with the processor, wherein the touchpad module comprises a circuit board and a surface mount device switch, wherein the circuit board comprises at least one circuit board contact part, and the surface mount device switch comprises:
      a pedestal located under the circuit board, and comprising a first conducting part, a second conducting part and at least one pedestal contact part, wherein the at least one pedestal contact part is electrically connected with the at least one circuit board contact part;
      a metal dome; and
      at least one conductive buffering sheet arranged between the metal dome and the pedestal, and contacted with the first conducting part and/or the second conducting part, wherein when the circuit board is pressed down and the surface mount device switch is moved downwardly to push a triggering part, the metal dome is subjected to deformation and contacted with the at least one conductive buffering sheet, so that the first conducting part and the second conducting part are electrically connected with each other.

10. The computing device according to claim 9, wherein the touchpad module further comprises a covering plate, and the covering plate is located over the circuit board.

11. The computing device according to claim 10, wherein the covering plate is a glass covering plate or a plastic covering plate, and the covering plate and the circuit board are combined together through an adhesive layer.

12. The computing device according to claim 9, wherein the conductive buffering sheet is an anisotropic conductive sheet.

13. The computing device according to claim 9, wherein the surface mount device switch further comprises a sheltering plate, wherein the sheltering plate is located under the pedestal, and the metal dome and the at least one conductive buffering sheet are covered between the pedestal and the sheltering plate.

14. The computing device according to claim 9, wherein the at least one pedestal contact part includes at least one electric pad or at least one pin.

15. The computing device according to claim 9, wherein the fixing frame comprises an accommodation space and the triggering part, wherein the triggering part is disposed on an inner surface of the fixing frame, and the circuit board and the surface mount device switch are accommodated within the accommodation space.

16. A surface mount device switch for a touchpad module with a circuit board, the surface mount device switch comprising:
 a pedestal comprising a first conducting part, a second conducting part and at least one pedestal contact part, wherein the at least one pedestal contact part is electrically connected with the circuit board;
 a metal dome; and
 at least one conductive buffering sheet arranged between the metal dome and the pedestal, and contacted with the first conducting part and/or the second conducting part,
 wherein when the surface mount device switch pushes a triggering part, the metal dome is subjected to deformation and contacted with the at least one conductive buffering sheet, so that the first conducting part and the second conducting part are electrically connected with each other.

17. The surface mount device switch according to claim 16, wherein the conductive buffering sheet is an anisotropic conductive sheet.

18. The surface mount device switch according to claim 16, wherein the surface mount device switch further comprises a sheltering plate, wherein the sheltering plate is located under the pedestal, and the metal dome and the at least one conductive buffering sheet are covered between the pedestal and the sheltering plate.

19. The surface mount device switch according to claim 16, wherein the at least one pedestal contact part includes at least one electric pad or at least one pin.

* * * * *